United States Patent
Hosoya

(10) Patent No.: US 8,389,184 B2
(45) Date of Patent: Mar. 5, 2013

(54) REFLECTIVE MASK BLANK AND METHOD OF MANUFACTURING A REFLECTIVE MASK

(75) Inventor: Morio Hosoya, Tokyo (JP)

(73) Assignee: Hoya Corporation, Tokyo (JP)

( * ) Notice: Subject to any disclaimer, the term of this patent is extended or adjusted under 35 U.S.C. 154(b) by 55 days.

(21) Appl. No.: 13/122,024

(22) PCT Filed: Jan. 29, 2010

(86) PCT No.: PCT/JP2010/051204
§ 371 (c)(1), (2), (4) Date: May 16, 2011

(87) PCT Pub. No.: WO2010/090132
PCT Pub. Date: Aug. 12, 2010

(65) Prior Publication Data
US 2011/0281207 A1    Nov. 17, 2011

(30) Foreign Application Priority Data

Feb. 4, 2009  (JP) .................................. 2009-023957
May 12, 2009  (JP) .................................. 2009-115307

(51) Int. Cl.
*G03F 1/24*   (2012.01)

(52) U.S. Cl. ........................................................ 430/5
(58) Field of Classification Search .............. 430/5, 394; 428/428, 430; 378/35
See application file for complete search history.

(56) References Cited

U.S. PATENT DOCUMENTS
2005/0208389 A1   9/2005   Ishibashi et al.

FOREIGN PATENT DOCUMENTS
JP    8-213303 A    8/1996
JP    2004-006798 A    1/2004

*Primary Examiner* — Stephen Rosasco
(74) *Attorney, Agent, or Firm* — Sughrue Mion, PLLC

(57) ABSTRACT

Disclosed is a reflective mask blank (10) which comprises a substrate (1), a multilayer reflective film (2) for reflecting exposure light, a buffer film (3), and an absorber film (4) for absorbing exposure light, said films being sequentially formed on the substrate. The absorber film (4) has a multilayer structure which is composed of an uppermost layer (4b) and a lower layer (4a). The uppermost layer is formed from a material containing oxide, oxynitride or carbide of Ta, and has a refractive index (n) of 0.95-0.97 and an extinction coefficient (k) of from −0.033 to −0.023. The lower layer is formed from a material containing Ta, and has a refractive index (n) of 0.94-0.97 and an extinction coefficient (k) of from −0.050 to −0.036. A reflective mask (20) can be obtained by forming a transfer pattern on the absorber film of the reflective mask blank.

8 Claims, 2 Drawing Sheets

REFLECTIVE MASK BLANK AND METHOD OF MANUFACTURING A REFLECTIVE MASK

CROSS REFERENCE TO RELATED APPLICATIONS

This is a National Stage of International Application No. PCT/JP2010/051204 filed Jan. 29, 2009, claiming priority based on Japanese Patent Application No. 2009-023957 filed Feb. 4, 2009 and 2009-115307 filed May 12, 2009, the contents of all of which are incorporated herein by reference in their entirety.

TECHNICAL FIELD

This invention relates to an exposure reflective mask for use in the manufacture of semiconductor devices or the like and to a reflective mask blank serving as a base for manufacturing the same.

BACKGROUND ART

In recent years, with higher integration of semiconductor devices, fine patterns exceeding the transfer limit of the photolithography technique have been required in the semiconductor industry. In view of this, the EUV lithography being an exposure technique using extreme ultraviolet (Extreme Ultra Violet: hereinafter referred to as EUV) light with a shorter wavelength is expected to be promising. Herein, the EUV light represents light in a wavelength band of the soft X-ray region or the vacuum ultraviolet region and, specifically, light having a wavelength of about 0.2 to 100 nm. As a mask for use in the EUV lithography, there is proposed an exposure reflective mask, for example, described in Patent Document 1 noted below.

This reflective mask has a multilayer reflective film formed on a substrate and adapted to reflect exposure light, a buffer film formed in a pattern on the multilayer reflective film, and further an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The light incident on the reflective mask mounted in an exposure apparatus (pattern transfer apparatus) is absorbed at a portion where the absorber film is present, but is reflected by the multilayer reflective film at a portion where the absorber film is not present so that an optical image is transferred onto a semiconductor substrate through a reflective optical system.

PRIOR ART DOCUMENT

Patent Document
  Patent Document 1: JP-A-H8-213303

DISCLOSURE OF THE INVENTION

Problem to be Solved by the Invention
  In order to transfer a fine pattern to a semiconductor substrate or the like with high accuracy using a reflective mask, it is important to improve the mask contrast for exposure light such as EUV light.
  For that purpose, it is necessary to improve the performance of absorbing the exposure light such as the EUV light in an absorber film to thereby enhance its light-shielding ability. It is also important to suppress the surface reflection for the exposure light on a surface of the absorber film.
  It is therefore an object of this invention to provide a reflective mask blank that is improved in contrast for exposure light when used in the form of a mask, and a reflective mask manufactured using such a reflective mask blank.
  It is another object of this invention to provide a reflective mask blank that can improve the pattern resolution at a pattern edge portion to enable high-resolution pattern transfer, and a reflective mask manufactured using such a reflective mask blank.

Means for Solving the Problem
  Various aspects of this invention will be described hereinbelow. In the following description, a refractive index n and an extinction coefficient k are numerical values when EUV light (wavelength 13 to 14 nm) is used as exposure light.
  (Aspect 1) A reflective mask blank for use in EUV lithography using EUV light as exposure light, comprising a substrate, a multilayer reflective film which is formed on the substrate and adapted to reflect the exposure light, and an absorber film which is formed on the multilayer reflective film and adapted to absorb the exposure light, wherein the absorber film has a laminated structure comprising an uppermost layer and a lower layer other than the uppermost layer, wherein the uppermost layer is formed of a material containing one of an oxide, a nitride, an oxynitride, and a carbide of tantalum (Ta) and has a refractive index n in a range of 0.95 to 0.97 and an extinction coefficient k in a range of −0.033 to −0.023, and wherein the lower layer is formed of a material containing tantalum (Ta) and has a refractive index n in a range of 0.94 to 0.97 and an extinction coefficient k in a range of −0.050 to −0.036.
  According to the reflective mask blank of the Aspect 1, the absorber film has the laminated structure comprising the uppermost layer and the lower layer other than the uppermost layer, wherein the uppermost layer is formed of the material containing one of the oxide, the nitride, the oxynitride, and the carbide of tantalum (Ta) and a selection is made of the material of which the extinction coefficient k is low to allow easy transmission of the EUV exposure light therethrough and wherein the lower layer is formed of the material containing tantalum (Ta) and a selection is made of the material of which the extinction coefficient k is higher than that of the uppermost layer. This makes it possible to suppress the surface reflection for the EUV exposure light with the uppermost layer while ensuring sufficient light-shielding performance for the EUV exposure light mainly with the lower layer. As a result, it is possible to obtain a reflective mask of which the mask contrast for the exposure light is improved.
  Further, by setting the refractive indices n and the extinction coefficients k of the uppermost layer and the lower layer in the respective predetermined ranges, it is possible to increase the interference effect between the exposure light transmitted through the uppermost layer and reflected by the lower layer and the exposure light reflected by the multilayer reflective film so that it is possible to produce the phase shift effect at a pattern edge portion of the absorber film to thereby improve the pattern resolution at the pattern edge portion. As a result, it is possible to obtain a reflective mask that can achieve high-resolution pattern transfer.
  (Aspect 2) The reflective mask blank according to aspect 1, wherein the lower layer of the absorber film further contains at least one or more elements selected from boron (B) and nitrogen (N).
  According to the reflective mask blank of the Aspect 2, the lower layer of the absorber film can further contain at least one or more elements selected from boron (B) and nitrogen (N). By containing B, it is possible to further improve the amorphous properties and the surface smoothness of the absorber film. Further, even in the case where the material composed mainly of the oxide of tantalum is used as the uppermost layer, it is possible to decrease lowering of the conductivity due to oxidation and thus to suppress the occurrence of charge-up during electron beam pattern writing on a resist film formed on the uppermost layer. By containing N, the film stress of the absorber film is reduced and the adhesion thereof to a buffer film or the multilayer reflective film under the absorber film becomes excellent.

(Aspect 3) The reflective mask blank according to aspects 1 or 2, comprising a buffer film between the multilayer reflective film and the absorber film, wherein the buffer film is formed of a material containing a nitride of chromium (Cr) and has a refractive index n in a range of 0.90 to 0.95 and an extinction coefficient k in a range of −0.043 to −0.030.

According to the reflective mask blank of the Aspect 3, in addition to the above-mentioned effects, it is possible to prevent the multilayer reflective film from being damaged due to etching during pattern formation and pattern correction of the absorber film. Since the buffer film containing the nitride of Cr has the refractive index n in the range of 0.90 to 0.95 and the extinction coefficient k in the range of −0.043 to −0.030, the absorptance for the EUV exposure light becomes high so that it is possible to reduce the thickness of the absorber film (particularly the lower layer) correspondingly. As a consequence, there is exhibited an effect of suppressing thickening of a pattern on a resist film on a semiconductor substrate as a transfer target, which is otherwise caused by the shadowing effect.

(Aspect 4) A method of manufacturing a reflective mask, comprising forming an absorber film pattern, which serves as a transfer pattern for a transfer target, in the absorber film of the reflective mask blank according to any one of aspects 1 to 3.

As recited in the Aspect 4, by manufacturing the reflective mask using the reflective mask blank of any one of the Aspects 1 to 3, it is possible to obtain the reflective mask that can improve the mask contrast for the exposure light in use thereof and that can achieve high-resolution pattern transfer.

EFFECT OF THE INVENTION

According to this invention, it is possible to provide a reflective mask blank that is improved in mask contrast for exposure light when used in the form of a mask, and a reflective mask manufactured using such a reflective mask blank. Further, according to this invention, it is possible to provide a reflective mask blank that can improve the pattern resolution at a pattern edge portion to enable high-resolution pattern transfer, and a reflective mask manufactured using such a reflective mask blank.

MODE FOR CARRYING OUT THE INVENTION

Figure 1:
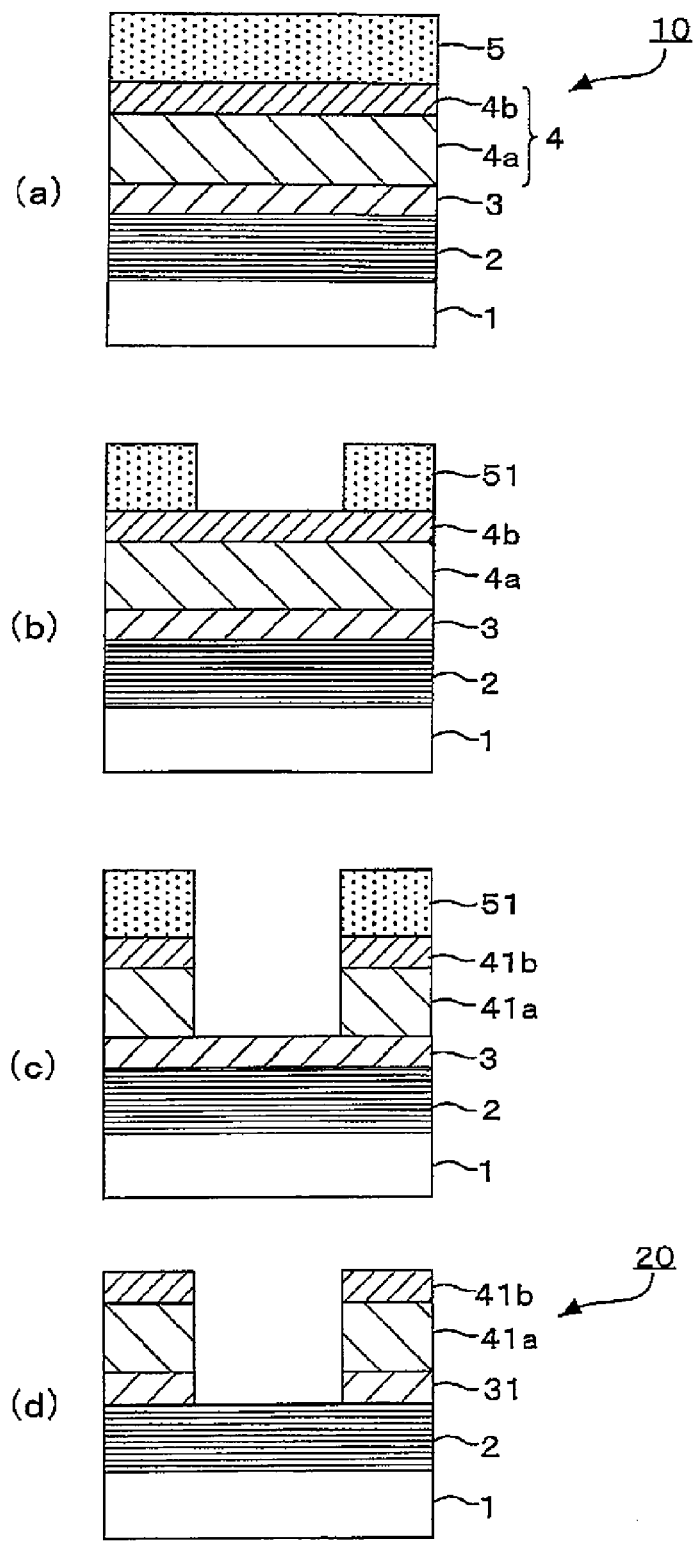
FIG. 1 is cross-sectional views showing the structure of an embodiment of a reflective mask blank and showing processes of manufacturing a reflective mask using this mask blank.

Hereinbelow, an embodiment of this invention will be described. In the following description, "mask contrast" represents a value defined by a contrast of a reflective mask for EUV exposure light, that is, contrast=reflectance ratio=1: (reflectance from multilayer reflective film/reflectance from absorber film).

A reflective mask blank according to an embodiment of the present invention is for use in EUV lithography using EUV light as exposure light and comprises a substrate, a multilayer reflective film formed on the substrate and adapted to reflect the exposure light, and an absorber film formed on the multilayer reflective film and adapted to absorb the exposure light. The absorber film has a laminated structure comprising an uppermost layer and a lower layer other than the uppermost layer. The uppermost layer is formed of a material containing one of an oxide, a nitride, an oxynitride, and a carbide of tantalum (Ta) and has a refractive index n in a range of 0.95 to 0.97 and an extinction coefficient k in a range of −0.033 to −0.023. The lower layer is formed of a material containing tantalum (Ta) and has a refractive index n in a range of 0.94 to 0.97 and an extinction coefficient k in a range of −0.050 to −0.036.

According to this reflective mask blank, since the extinction coefficients k and the refractive indices n of the uppermost layer and the lower layer of the absorber film which are formed of the materials containing tantalum (Ta) are respectively in the above-mentioned predetermined ranges, it is possible to obtain the reflective mask blank of which the mask contrast for the exposure light is improved when used in the form of a mask, and a reflective mask manufactured using such a reflective mask blank.

The uppermost layer of the absorber film is formed of the material containing one of the oxide, the nitride, the oxynitride, and the carbide of tantalum (Ta) and has the refractive index n in the range of 0.95 to 0.97 and the extinction coefficient k in the range of −0.033 to −0.023. If the extinction coefficient k is less than 0.023, the absorptance for the EUV exposure light decreases so that it becomes necessary to increase the thickness of the absorber layer for realizing a required contrast. As a result, there arises a problem that pattern thickening due to the shadowing effect becomes large to make it difficult to correct a transfer pattern. On the other hand, if the extinction coefficient k is higher than 0.033, there arises a problem that the transmittance for the EUV exposure light becomes low, thus reducing the effect of suppressing the surface reflection for the EUV exposure light with the uppermost layer. If the refractive index n is less than 0.95, there arises a problem that reflected light of the EUV exposure light at the interface (interface reflected light) between the uppermost layer and the lower layer becomes strong so that it is difficult to suppress the interface reflected light. On the other hand, if an attempt is made to realize the uppermost layer having a property of the refractive index n greater than 0.97 using the material containing the tantalum compound, there arises a problem that the film quality should be rough and thus, in terms of the etchability, it is difficult to realize a fine pattern with a low line edge roughness. Particularly preferably, the refractive index n of the uppermost layer is in the range of 0.945 to 0.965 and the extinction coefficient k thereof is in the range of −0.0320 to −0.0240.

As typical compound examples of the oxide, the nitride, the oxynitride, and the carbide of Ta, there can be cited, for example, TaO, TaON, TaN, TaC, TaCN, and so on. The material forming the uppermost layer of the absorber film may further contain boron (B). By containing B, it is possible to further improve the amorphous properties and the surface smoothness of the film. As typical compound examples, there can be cited, for example, TaBO, TaB, TaBN, TaBCN, and so on.

For example, in the case of the material containing Ta and O (oxide of Ta), it is possible to obtain a refractive index n in the range of 0.9556 to 0.9647 and an extinction coefficient k in the range of −0.0312 to −0.0249 depending on the composition ratio of Ta and O. In the case of the material containing Ta, B, and O, it is possible to obtain a refractive index n in the range of 0.9496 to 0.9571 and an extinction coefficient k in the range of −0.0303 to −0.0257 depending on the composition ratio of Ta, B, and O.

With respect to the material forming the uppermost layer of the absorber film, the composition ratio does not need to be particularly limited as long as the refractive index n and the extinction coefficient k of the formed film are respectively in the above-mentioned predetermined ranges. However, for example, in terms of the etchability in the formation of a transfer pattern, the composition ratio Ta/O is preferably in the range of 30/50 to 75/15 (at % ratio) in the material containing Ta and O and, in the material containing Ta, B, and N, when N is 10 to 30 at % and the balance is given as 100, B is preferably 5 to 30 at %.

The thickness of the uppermost layer of the absorber film can be set to about 50 to 100 nm, but is preferably optimized for enhancing the transmittance for the EUV exposure light. In this case, it is particularly preferable that the thickness of the uppermost layer of the absorber film be set in the range of 5 to 20 nm, in terms of reducing the thickness of the absorber film.

On the other hand, the lower layer of the absorber film is formed of the material containing tantalum (Ta) and has the refractive index n in the range of 0.94 to 0.97 and the extinction coefficient k in the range of −0.050 to −0.036. If the extinction coefficient k of the lower layer is less than 0.036, there arises a problem that the absorption performance for the EUV exposure light with the lower layer cannot be sufficiently obtained. On the other hand, if the extinction coefficient k of the lower layer is higher than 0.050, there arises a problem that the refractive index at the interface between the uppermost layer and the lower layer becomes high so that the contrast cannot be improved. Also in the case where the refractive index n is less than 0.94, there arises a problem that the refractive index at the interface between the uppermost layer and the lower layer becomes high so that the contrast cannot be improved. On the other hand, if the refractive index n is greater than 0.97, there arises a problem that reflected light of the EUV exposure light at the interface (interface reflected light) between the uppermost layer and the lower layer becomes strong so that it is difficult to suppress the interface reflected light. Particularly preferably, the refractive index n of the lower layer is in the range of 0.945 to 0.965 and the extinction coefficient k thereof is in the range of −0.049 to −0.037.

As the lower layer of the absorber film, particularly Ta alone or a material composed mainly of Ta can be preferably used. As the material composed mainly of Ta, it is possible to suitably use, for example, a material containing Ta and B, a material containing Ta and N, a material containing Ta and B and further containing at least one of O and N, or the like. As described before, by adding, for example, B to Ta, an amorphous material can be easily obtained to improve the smoothness. Further, even in the case where the material composed mainly of the oxide of tantalum is used as the uppermost layer, it is possible to decrease lowering of the conductivity due to oxidation and thus to suppress the occurrence of charge-up during electron beam pattern writing on a resist film formed on the uppermost layer. On the other hand, by adding N or O to Ta, the resistance to oxidation is improved and therefore there is obtained an effect of improving the temporal stability.

For example, in the case of the film of Ta alone, it is possible to obtain a refractive index n in the range of 0.9548 to 0.9617 and an extinction coefficient k in the range of −0.0479 to −0.0406. In the case of the material containing Ta and B, it is possible to obtain a refractive index n in the range of 0.9513 to 0.9627 and an extinction coefficient k in the range of −0.0490 to −0.0376 depending on the composition ratio of Ta and B. In the case of the material containing Ta and N, it is possible to obtain a refractive index n in the range of 0.9500 to 0.9547 and an extinction coefficient k in the range of −0.0457 to −0.0414 depending on the composition ratio of Ta and N. In the case of the material containing Ta, B, and N, it is possible to obtain a refractive index n in the range of 0.9480 to 0.9559 and an extinction coefficient k in the range of −0.0470 to −0.0401 depending on the composition ratio of Ta, B, and N.

In the case of using, as the lower layer of the laminated-structure absorber film, the material composed mainly of Ta, such as the material containing Ta and B, the material containing Ta and N, or the material containing Ta, B, and N, the composition ratio does not need to be particularly limited as long as the refractive index n of the formed film is in the range of 0.94 to 0.97 and the extinction coefficient k thereof is in the range of −0.050 to −0.036. However, for example, in terms of the etchability in the formation of a transfer pattern, the composition ratio Ta/B is preferably in the range of 90/5 to 70/30 (at % ratio) in the material containing Ta and B, the composition ratio Ta/N is preferably in the range of 90/10 to 50/50 (at % ratio) in the material containing Ta and N, and, in the material containing Ta, B, and N, when N is 10 to 40 at % and the balance is given as 100, B is preferably 5 to 30 at %.

The lower layer of the absorber film is required to have a thickness that can sufficiently ensure the light-shielding ability with respect to the EUV exposure light, and it is normally about 30 to 100 nm.

Also in the case of the laminated-structure absorber film, the uppermost layer and the lower layer are preferably formed by sputtering such as magnetron sputtering. For example, in the case of the TaBN film, it can be formed by sputtering using a target containing Ta and B and using an argon gas added with nitrogen. In the case of the TaO film, it can be formed by sputtering using a Ta target and using an argon gas added with oxygen. In the case of the film formation by sputtering, the film density and the internal stress can be controlled by changing the power and the introducing gas pressure applied to the sputtering target. Further, since the film formation is enabled at a low temperature such as about room temperature, the thermal influence to the multilayer reflective film and so on can be made small.

Either of the uppermost layer and the lower layer of the laminated-structure absorber film does not necessarily have a uniform composition over its entirety and, for example, each may have a composition gradient so that the composition changes in a thickness direction of the film. In the composition gradient, the composition of contained elements may change continuously or stepwise.

According to the reflective mask blank described above, there are obtained a reflective mask blank having the following effects and a reflective mask manufactured using such a reflective mask blank.

(1) That is, the absorber film has the laminated structure comprising the uppermost layer and the lower layer other than the uppermost layer, wherein the uppermost layer is formed of the material containing one of the oxide, the nitride, the oxynitride, and the carbide of tantalum (Ta) and a selection is made of the material of which the extinction coefficient k is low to allow easy transmission of the EUV exposure light therethrough and wherein the lower layer is formed of the material containing tantalum (Ta) and a selection is made of the material of which the extinction coefficient k is higher than that of the uppermost layer. This makes it possible to suppress the surface reflection for the EUV exposure light with the uppermost layer while ensuring sufficient light-shielding performance for the EUV exposure light mainly with the lower layer. As a result, it is possible to obtain a reflective mask of which the mask contrast for the exposure light is improved.

That is, it is possible to suppress the surface reflection by enhancing the exposure light transmittance in the uppermost layer in use of the mask and to improve the mask contrast for the EUV light as the exposure light, so that a fine pattern can be transferred with high accuracy.

(2) By setting the refractive indices n and the extinction coefficients k of the uppermost layer and the lower layer of the absorber film in the respective predetermined ranges, it is possible to increase the interference effect between the exposure light transmitted through the uppermost layer and reflected by the lower layer and the exposure light reflected by the multilayer reflective film so that it is possible to produce the phase shift effect at a pattern edge portion of the absorber film to thereby improve the pattern resolution at the pattern edge portion. As a result, it is possible to obtain a reflective mask that can achieve high-resolution pattern transfer.

A buffer film having etching characteristics different from those of the absorber film may be formed between the multilayer reflective film and the absorber film. By forming such a buffer film, the multilayer reflective film is prevented from being damaged due to etching during pattern formation and pattern correction of the absorber film. In particular, high smoothness can be obtained with the buffer film made of a chromium-based material containing chromium and therefore a surface of the absorber film formed thereon can also obtain high smoothness so that pattern blur can be reduced.

As the chromium-based material, particularly a material containing a nitride of chromium (Cr) can be preferably cited. The buffer film preferably has a refractive index n in the range of 0.90 to 0.95 and an extinction coefficient k in a range of −0.043 to −0.030. Since the buffer film containing the nitride of chromium has the refractive index n in the range of 0.90 to 0.95 and the extinction coefficient k in the range of −0.043 to −0.030, the absorptance for the EUV exposure light becomes high so that it is possible to reduce the thickness of the absorber film (particularly the lower layer) correspondingly. As a consequence, there is exhibited an effect of suppressing thickening of a pattern on a resist film on a semiconductor substrate as a transfer target, which is otherwise caused by the shadowing effect.

Each of the above-mentioned reflective mask blanks may have a resist film, for forming a predetermined transfer pattern, on an upper surface of the absorber film.

As reflective masks obtained using the above-mentioned reflective mask blanks, the following aspects are cited.

(1) A reflective mask in which a buffer film is formed on a multilayer reflective film formed on a substrate and an absorber film pattern in the form of a predetermined transfer pattern is formed on the buffer film.

(2) A reflective mask in which a pattern of a buffer film and an absorber film in the form of a predetermined transfer pattern is formed on a multilayer reflective film formed on a substrate.

(3) A reflective mask in which an absorber film pattern in the form of a predetermined transfer pattern is formed on a multilayer reflective film formed on a substrate.

FIG. 1 is schematic cross-sectional views showing a reflective mask blank according to an embodiment of this invention and showing processes of manufacturing a reflective mask using this mask blank.

As shown in FIG. 1(a), this reflective mask blank has a structure in which a multilayer reflective film 2 is formed on a substrate 1, and a buffer film 3 and an absorber film 4 having a laminated structure of a lower layer 4a and an uppermost layer 4b are formed on the multilayer reflective film 2. Further, a resist film 5 is provided on an upper surface of the absorber film 4.

In order to prevent pattern deformation due to heat during exposure, the substrate 1 preferably has a low thermal expansion coefficient in the range of $0\pm1.0\times10^{-7}/°$ C. and more preferably in the range of $0\pm0.3\times10^{-7}/°$ C. As a material having a low thermal expansion coefficient in this range, it is possible to use any of an amorphous glass, a ceramic, and a metal. For example, use can be made of a $SiO_2$—$TiO_2$-based glass or a quartz glass in the case of an amorphous glass or of a crystallized glass precipitated with p-quartz solid solution or the like in the case of a crystallized glass. As an example of a metal substrate, an Invar alloy (Fe—Ni-based alloy) or the like can be cited. It is also possible to use a single-crystal silicon substrate.

Further, in order to obtain high reflectance and high transfer accuracy, the substrate 1 preferably has high smoothness and flatness. In particular, the substrate 1 preferably has a surface with a smoothness of 0.2 nm or less in Rms (smoothness in a 10 μm square area) and a flatness of 50 nm or less (flatness in a 142 mm square area). Further, the substrate 1 preferably has high rigidity in order to prevent deformation thereof due to the film stress of a film to be formed thereon. In particular, the substrate 1 preferably has a high Young's modulus of 65 GPa or more.

The unit Rms representing the smoothness is a root mean square roughness which can be measured by an atomic force microscope. The flatness is a value representing a warp (deformation amount) of a surface given by TIR (Total Indicated Reading) and, assuming that a plane determined by the method of least squares on the basis of a substrate surface is given as a focal plane, the flatness is an absolute value of a height difference between the highest position of the substrate surface located above the focal plane and the lowest position of the substrate surface located below the focal plane.

The multilayer reflective film 2 is, as described before, a multilayer film in which elements with different refractive indices are periodically laminated and, in general, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of the aforementioned Mo/Si cycle laminated film in which Mo films and Si films are alternately laminated by about 40 cycles. As other multilayer reflective films for use in the region of the EUV light, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and so on. The material may be properly selected according to the exposure wavelength.

The multilayer reflective film 2 can be formed by depositing each layer by DC magnetron sputtering, ion beam sputtering, or the like. In the case of the above-mentioned Mo/Si cycle multilayer film, using, for example, the ion beam sputtering, a Si target is first used to form a Si film having a thickness of about several nm, then a Mo target is used to form a Mo film having a thickness of about several nm and, given that this forms one cycle, Si and Mo films are laminated by 40 to 60 cycles and, finally, a Si film is formed.

A protective film made of a material such as, for example, ruthenium (Ru), its compound, or the like may be provided between the multilayer reflective film 2 and the buffer film 3 or between the multilayer reflective film 2 and the absorber film 4 (in the case of having no buffer film 3). With this protective film, the multilayer reflective film is prevented from being damaged due to etching during pattern formation of the buffer film or the absorber film so that it is possible to prevent a reduction in exposure light reflectance. As the ruthenium compound, there can be cited, for example, RuNb, RuZr, or the like.

As the buffer film 3, the above-mentioned chromium-based buffer film can be preferably used, for example. The buffer film 3 can be formed on the multilayer reflective film by sputtering such as ion beam sputtering other than DC sputtering or RF sputtering.

When performing correction of an absorber film pattern using, for example, a focused ion beam (FIB), the thickness of the buffer film 3 is preferably set to about 20 to 60 nm, but when the FIB is not used, it can be set to about 5 to 15 nm.

Next, the absorber film 4 has a function of absorbing, for example, the EUV light as the exposure light and, in the embodiment shown in FIG. 1, has the laminated structure of the lower layer 4a and the uppermost layer 4b. Such an absorber film is as described before.

In the embodiment shown in FIG. 1, the reflective mask blank 10 is configured as described above and thus has the buffer film. However, according to a method of forming a pattern of the absorber film 4 or a method of correcting the formed pattern, the reflective mask blank 10 may be configured such that the buffer film is not provided.

Next, a description will be given of the processes of manufacturing a reflective mask using the reflective mask blank 10.

The materials and the forming methods of the respective layers of the reflective mask blank 10 (see FIG. 1(a)) are as described above.

A predetermined transfer pattern is formed in the absorber film 4 of the reflective mask blank 10. First, the resist film 5 on the absorber film 4 is subjected to predetermined pattern writing by the use of an electron beam writing apparatus and then to development, thereby forming a predetermined resist pattern 51 (see FIG. 1(b)).

Using the formed resist pattern 51 as a mask, the uppermost layer 4b and the lower layer 4a of the absorber film 4 are dry-etched to thereby form an absorber film pattern (laminated pattern of an uppermost layer pattern 41b and a lower layer pattern 41a) in the form of the predetermined transfer pattern (see FIG. 1(c)). In the case where the uppermost layer 4b and the lower layer 4a of the absorber film 4 are each made of a material composed mainly of Ta, use can be made of dry etching using a chlorine gas.

The resist pattern 51 remaining on the uppermost layer pattern 41b is removed using hot concentrated sulfuric acid.

Normally, an inspection is carried out herein to check whether or not the absorber film pattern (laminated pattern of the lower layer pattern 41a and the uppermost layer pattern 41b) is formed as designed. The inspection is carried out by causing inspection light for use in pattern inspection to be incident on a mask formed with the absorber film pattern and detecting the inspection light reflected by the uppermost layer pattern 41b and the inspection light reflected by the buffer film 3 exposed due to the removal of the absorber film 4 to thereby observe the contrast therebetween.

If, as a result thereof, there is detected, for example, a pinhole defect (white defect) formed by the removal of the absorber film 4 at a portion that should not be removed or an etching insufficient defect (black defect) where part of the absorber film 4 is not removed and thus remains due to insufficient etching, correction thereof is carried out.

For correcting the pinhole defect, there is, for example, a method of depositing a carbon film or the like in a pinhole by FIB-assisted deposition. On the other hand, for correcting the etching insufficient defect, there is, for example, a method of removing an unnecessary portion by FIB irradiation. In this event, the buffer film 3 serves as a protective film for protecting the multilayer reflective film 2 against the FIB irradiation.

After the pattern inspection and correction have been finished as described above, the exposed buffer film 3 is removed according to the absorber film pattern so as to be formed into a pattern 31, thereby manufacturing a reflective mask 20 (see FIG. 1(d)). Herein, for example, in the case where the buffer film is made of a Cr-based material, use can be made of dry etching using a mixed gas containing chlorine and oxygen. At a portion where the buffer film is removed, the multilayer reflective film 2 as a reflection area for the exposure light is exposed.

If the required reflectance can be obtained without removing the buffer film, the buffer film may be left on the multilayer reflective film without being processed into the same pattern as that of the absorber film.

Lastly, an inspection is carried out to finally confirm whether or not the absorber film pattern is formed with dimensional accuracy according to a specification.

The reflective mask manufactured using the above-mentioned reflective mask blank is particularly suitable for the EUV lithography using the EUV light (wavelength: about 0.2 to 100 nm) as exposure light, but is also properly applicable to other short-wavelength exposure light.

EXAMPLES

Hereinbelow, the embodiment of this invention will be described in further detail with reference to Examples.

Example 1

A substrate to be used was a $SiO_2$—$TiO_2$-based glass substrate (6-inch square, thickness 6.3 mm). This substrate had a thermal expansion coefficient of $0.2 \times 10^{-7}/°$ C. and a Young's modulus of 67 GPa. Then, this glass substrate was mechanically polished so as to have a surface with a smoothness of 0.2 nm or less in Rms and a flatness of 50 nm or less.

As a multilayer reflective film to be formed on the substrate, a Mo film/Si film cycle multilayer reflective film was employed so as to obtain the multilayer reflective film suitable for an exposure light wavelength band of 13 to 14 nm. That is, the multilayer reflective film was formed by using a Mo target and a Si target and alternately laminating films on the substrate by ion beam sputtering. A Si film was formed to 4.2 nm and a Mo film was formed to 2.8 nm and, given that this formed one cycle, films were laminated by 40 cycles, then a Si film was formed to 4.2 nm, and further thereon, a Ru film was formed to 2.5 nm as a protective film.

In this manner, a multilayer reflective film coated substrate was obtained. Reflectance was measured by applying EUV light of 13.5 nm to the multilayer reflective film at an incident angle of 6.0 degrees and it was 63%.

Then, a buffer film was formed on the protective film of the multilayer reflective film coated substrate thus obtained. As the buffer film, a chromium nitride film was formed to a thickness of 20 nm. The buffer film was formed by DC magnetron sputtering using a Cr target and using a mixed gas of argon (Ar) and nitrogen ($N_2$) as a sputtering gas. In the formed CrNx film, nitrogen (N) was 10 at % (x=0.1). The formed CrNx film had a refractive index n of 0.9223 and an extinction coefficient k of −0.0396. The refractive index n and the extinction coefficient k were measured by the low-angle EUV reflected light intensity measurement.

Then, on the buffer film, a material containing Ta, B, and N was deposited to a thickness of 50 nm as a lower layer of an absorber film. That is, the lower layer was formed by DC magnetron sputtering using a target containing Ta and B and adding nitrogen ($N_2$) in an amount of 10% to argon (Ar). The composition ratio of the formed TaBN film was such that Ta was 80 at %, B was 10 at %, and N was 10 at %.

Subsequently, a material containing Ta, B, and O was deposited to a thickness of 20 nm as an upper layer of the absorber film. That is, the upper layer was formed by DC magnetron sputtering using a target containing Ta and B and adding oxygen ($O_2$) in an amount of 10% to argon (Ar). The composition ratio of the formed TaBO film was such that Ta was 80 at %, B was 10 at %, and O was 10 at %.

The formed TaBN film (lower layer) had a refractive index n of 0.9493 and an extinction coefficient k of −0.0422 while the formed TaBO film (uppermost layer) had a refractive index n of 0.9511 and an extinction coefficient k of −0.0299. The refractive index n and the extinction coefficient k were measured by the above-mentioned method.

Transmittance was measured by applying EUV light of 13.5 nm to the TaBO film as the uppermost layer at an incident angle of 6.0 degrees and it was 0.8%.

In the manner described above, a reflective mask blank of this Example was manufactured.

Then, using this reflective mask blank, an EUV exposure reflective mask having a pattern of the DRAM hp32 nm generation of the design rule was manufactured in the following manner.

First, a resist film for electron beam writing was formed on the reflective mask blank, then predetermined pattern writing was carried out using an electron beam writing apparatus, and then development was carried out after the pattern writing, thereby forming a resist pattern.

Then, using this resist pattern as a mask, the uppermost layer and the lower layer of the absorber film were dry-etched using a chlorine gas, thereby forming the absorber film into a transfer pattern in the form of a laminated pattern of the lower layer and the uppermost layer.

Further, using a mixed gas of chlorine and oxygen, the buffer film remaining in a reflection area (portion with no pattern of the absorber film) was removed by dry etching according to the pattern of the absorber film, thereby exposing the multilayer reflective film having the Ru protective film on its surface. In this manner, a reflective mask was obtained.

A final confirmation inspection of the obtained reflective mask was carried out and it was confirmed that a pattern of the DRAM hp32 nm generation of the design rule was formed as designed. Further, the reflectance for the EUV light in the reflection area hardly changed as compared with the reflectance measured in the form of the multilayer reflective film coated substrate and it was 61.8%.

Figure 2:
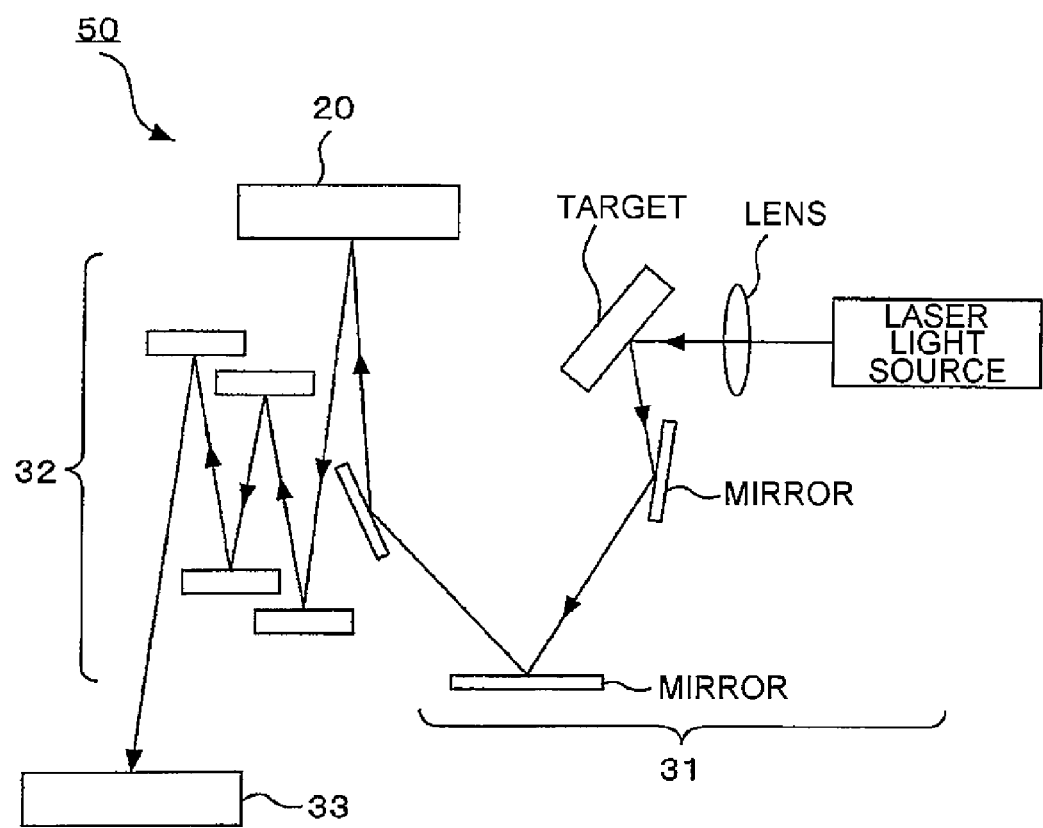
FIG. 2 is a diagram showing a schematic structure of a pattern transfer apparatus in which a reflective mask is mounted.

Then, using the obtained reflective mask of this Example, exposure transfer with EUV light onto a semiconductor substrate was carried out by the use of a pattern transfer apparatus shown in FIG. 2.

The pattern transfer apparatus 50 with the reflective mask mounted therein is roughly formed by a laser plasma X-ray source 31, a reduction optical system 32, and so on. The reduction optical system 32 uses X-ray reflecting mirrors. A pattern reflected from the reflective mask 20 is normally reduced in size to about a quarter through the reduction optical system 32. Since a wavelength band of 13 to 14 nm is used as an exposure wavelength, it was set in advance that an optical path was located in a vacuum.

In this state, the EUV light obtained from the laser plasma X-ray source 31 was incident on the reflective mask 20 and the light reflected therefrom was transferred onto a silicon wafer (resist layer coated semiconductor substrate) 33 through the reduction optical system 32.

The light incident on the reflective mask 20 is absorbed by the absorber film and thus is not reflected at a portion where the absorber film pattern is present, while it is reflected by the multilayer reflective film at a portion where the absorber film pattern is not present. In this manner, an image formed by the light reflected from the reflective mask 20 enters the reduction optical system 32. The exposure light through the reduction optical system 32 exposes a transfer pattern onto a resist layer of the silicon wafer 33. Then, by developing the exposed resist layer, a resist pattern is formed on the silicon wafer 33.

The pattern transfer onto the semiconductor substrate was carried out in the manner described above and it was confirmed that the mask contrast of the reflective mask of this Example was as high as 1:1000 and that the mask accuracy thereof was 4.8 nm or less which was an accuracy required by the DRAM hp32 nm design rule.

Example 2

A multilayer reflective film coated substrate was manufactured in the same manner as in Example 1 and, on a Ru protective film thereof, a buffer film in the form of a chromium nitride film was formed in the same manner as in Example 1.

Then, on this buffer film, a material containing Ta and N was deposited to a thickness of 60 nm as a lower layer of an absorber film. That is, the lower layer was formed by DC magnetron sputtering using a Ta target and adding nitrogen ($N_2$) in an amount of 10% to argon (Ar). The composition ratio of the formed TaN film was such that Ta was 80 at % and N was 20 at %.

Subsequently, a material containing Ta and O was deposited to a thickness of 20 nm as an uppermost layer of the absorber film. That is, the uppermost layer was formed by DC magnetron sputtering using a Ta target and adding oxygen ($O_2$) in an amount of 10% to argon (Ar). The composition ratio of the formed TaO film was such that Ta was 80 at % and O was 20 at %.

The formed TaN film (lower layer) had a refractive index n of 0.9532 and an extinction coefficient k of −0.0436 while the formed TaO film (uppermost layer) had a refractive index n of 0.9597 and an extinction coefficient k of −0.0264.

Transmittance was measured by applying EUV light of 13.5 nm to the TaO film as the uppermost layer at an incident angle of 6.0 degrees and it was 0.65%.

In the manner described above, a reflective mask blank of this Example was manufactured.

Then, using this reflective mask blank, a reflective mask was manufactured through the same processes as in Example 1.

A final confirmation inspection of the manufactured reflective mask was carried out and it was confirmed that a pattern of the DRAM hp32 nm generation of the design rule was formed as designed. Further, the reflectance for the EUV light in a reflection area hardly changed as compared with the reflectance measured in the form of the multilayer reflective film coated substrate and it was 61.5%.

Further, using the reflective mask of this Example, pattern transfer with EUV light onto a semiconductor substrate was carried out by the use of the pattern transfer apparatus shown in FIG. 2 in the same manner as in Example 1. As a result, it was confirmed that the mask contrast of the reflective mask of this Example was as high as 1:1000 and that the mask accuracy thereof was 4.8 nm or less which was an accuracy required by the DRAM hp32 nm design rule.

Example 3

A multilayer reflective film coated substrate was manufactured in the same manner as in Example 1 and, on a Ru protective film thereof, a buffer film in the form of a chromium nitride film was formed in the same manner as in Example 1.

Then, on this buffer film, a Ta film was formed to a thickness of 50 nm as a lower layer of an absorber film. That is, the lower layer was formed by DC magnetron sputtering using a Ta target in an argon gas (Ar).

Subsequently, a material containing Ta and O was deposited to a thickness of 20 nm as an uppermost layer of the absorber film. That is, the uppermost layer was formed by DC magnetron sputtering using a Ta target and adding oxygen ($O_2$) in an amount of 10% to argon (Ar). The composition ratio of the formed TaO film was such that Ta was 80 at % and O was 20 at %.

The formed Ta film (lower layer) had a refractive index n of 0.9597 and an extinction coefficient k of −0.0458 while the formed TaO film (uppermost layer) had a refractive index n of 0.9597 and an extinction coefficient k of −0.0264.

Transmittance was measured by applying EUV light of 13.5 nm to the TaO film as the uppermost layer at an incident angle of 6.0 degrees and it was 0.78%.

In the manner described above, a reflective mask blank of this Example was manufactured.

Then, using this reflective mask blank, a reflective mask was manufactured through the same processes as in Example 1.

A final confirmation inspection of the manufactured reflective mask was carried out and it was confirmed that a pattern of the DRAM hp32 nm generation of the design rule was formed as designed. Further, the reflectance for the EUV light in a reflection area hardly changed as compared with the reflectance measured in the form of the multilayer reflective film coated substrate and it was 61.7%.

Further, using the reflective mask of this Example, pattern transfer with EUV light onto a semiconductor substrate was carried out by the use of the pattern transfer apparatus shown in FIG. 2 in the same manner as in Example 1. As a result, it was confirmed that the mask contrast of the reflective mask of this Example was as high as 1:1000 and that the mask accuracy thereof was 4.8 nm or less which was an accuracy required by the DRAM hp32 nm design rule.

While this invention has been described with reference to the embodiment and the Examples, this invention is not limited thereto and can be changed in various ways that can be understood by a person skilled in the art.

This application claims priority from Japanese Patent Application No. 2009-23957 filed on Feb. 4, 2009 and Japanese Patent Application No. 2009-115307 filed on May 12, 2009, the disclosure of which is incorporated herein in its entirety by reference.

Description of Symbols
 1 substrate
 2 multilayer reflective film
 3 buffer film
 4 absorber film
 4a lower layer
 4b uppermost layer
 5 resist film
 10 reflective mask blank
 20 reflective mask
 50 pattern transfer apparatus

The invention claimed is:

1. A reflective mask blank for use in EUV lithography using EUV light as exposure light, comprising;
a substrate;
a multilayer reflective film which is formed on the substrate and adapted to reflect the exposure light; and
an absorber film which is formed on the multilayer reflective film and adapted to absorb the exposure light,
wherein the absorber film has a laminated structure comprising an uppermost layer and a lower layer other than the uppermost layer,
wherein the uppermost layer is formed of a material containing one of an oxide, a nitride, an oxynitride, and a carbide of tantalum (Ta) and has a refractive index n in a range of 0.95 to 0.97 and an extinction coefficient k in a range of −0.033 to −0.023, and
wherein the lower layer is formed of a material containing tantalum (Ta) and has a refractive index n in a range of 0.94 to 0.97 and an extinction coefficient k in a range of −0.050 to −0.036.

2. The reflective mask blank according to claim 1, wherein the lower layer of the absorber film further contains at least one or more elements selected from boron (B) and nitrogen (N).

3. The reflective mask blank according to claim 1, comprising a buffer film between the multilayer reflective film and the absorber film, wherein the buffer film is formed of a material containing a nitride of chromium (Cr) and has a refractive index n in a range of 0.90 to 0.95 and an extinction coefficient k in a range of −0.043 to −0.030.

4. A method of manufacturing a reflective mask, comprising forming an absorber film pattern, which serves as a transfer pattern for a transfer target, in the absorber film of the reflective mask blank according to claim 1.

5. A method of manufacturing a reflective mask, comprising forming an absorber film pattern, which serves as a transfer pattern for a transfer target, in the absorber film of the reflective mask blank according to claim 2.

6. A method of manufacturing a reflective mask, comprising forming an absorber film pattern, which serves as a transfer pattern for a transfer target, in the absorber film of the reflective mask blank according to claim 3.

7. The reflective mask blank according to claim 1, comprising a buffer film between the multilayer reflective film and the absorber film, wherein the buffer film is formed of a material containing a nitride of chromium (Cr) and has a refractive index n in a range of 0.90 to 0.95 and an extinction coefficient k in a range of −0.043 to −0.030.

8. A method of manufacturing a reflective mask, comprising forming an absorber film pattern, which serves as a transfer pattern for a transfer target, in the absorber film of the reflective mask blank according to claim 7.

* * * * *